(12) United States Patent
Xi et al.

(10) Patent No.: US 10,825,801 B2
(45) Date of Patent: Nov. 3, 2020

(54) DISPLAY DEVICE

(71) Applicant: Au Optronics Corporation, Hsinchu (TW)

(72) Inventors: Peng-Bo Xi, Taipei (TW); Chen-Chi Lin, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 25 days.

(21) Appl. No.: 16/232,066

(22) Filed: Dec. 26, 2018

(65) Prior Publication Data
US 2020/0020672 A1 Jan. 16, 2020

(30) Foreign Application Priority Data
Jul. 16, 2018 (TW) .............................. 107124532 A

(51) Int. Cl.
*H01L 27/12* (2006.01)
*H01L 25/075* (2006.01)
(Continued)

(52) U.S. Cl.
CPC ...... *H01L 25/0753* (2013.01); *H01L 27/1214* (2013.01); *H01L 33/60* (2013.01); *H01L 33/62* (2013.01)

(58) Field of Classification Search
CPC ....... H01L 33/36; H01L 33/38; H01L 33/385; H01L 33/387; H01L 33/42; H01L 33/50; H01L 33/502; H01L 33/505; H01L 33/507; H01L 33/58; H01L 33/60; H01L 33/62; H01L 27/1255; H01L 27/1214; H01L 27/124; H01L 27/1251; H01L 27/156; H01L 27/32; H01L 27/322; H01L 27/3237; H01L 27/3244; H01L 27/3248; H01L 27/3246; H01L 2027/11809; H01L 2027/11862; H01L 2027/11866;
(Continued)

(56) References Cited

U.S. PATENT DOCUMENTS 8,044,893 B2 10/2011 Nathan et al.
8,188,476 B2 5/2012 Takagi et al.
(Continued)

FOREIGN PATENT DOCUMENTS

| CN | 101728421 | 1/2013 |
|---|---|---|
| CN | 106328673 | 1/2017 |
| TW | I312639 | 7/2009 |

*Primary Examiner* — Natalia A Gondarenko
(74) *Attorney, Agent, or Firm* — JCIPRNET

(57) ABSTRACT

A display device includes a substrate, a first pixel circuit, a second pixel circuit, a third pixel circuit, a protective layer, a first conductive structure, a second conductive structure, a third conductive structure, first light emitting diodes (LEDs), second LEDs and third LEDs. The first pixel circuit, the second pixel circuit and the third pixel circuit are located on the substrate. The second pixel circuit is located between the first pixel circuit and the third pixel circuit. The protective layer covers the first pixel circuit, the second pixel circuit and the third pixel circuit. The first conductive structure is electrically connected to the first pixel circuit through the first opening of the protective layer. The first LEDs are overlapped with the first pixel circuit and the second pixel circuit. The first LEDs are electrically connected to the first conductive structure.

11 Claims, 12 Drawing Sheets

(51) Int. Cl.
*H01L 33/62* (2010.01)
*H01L 33/60* (2010.01)

(58) Field of Classification Search
CPC . H01L 2027/11875; H01L 2027/11879; H01L 2027/11881; H01L 2027/1189; H01L 2027/11892; H01L 25/0753; H01L 2924/12041; H01L 27/3255; H01L 27/326; H01L 27/3265; H01L 27/3272; H01L 27/3276; H01L 27/3293; H01L 27/3258; H01L 51/5228; H01L 51/56; H01L 51/5234; H01L 2251/558; H01L 33/08; H01L 33/18; H01L 33/40; H01L 33/405; H01L 33/44; H01L 33/46; H01L 33/48; H01L 33/486; H01L 33/504; H01L 33/52; H01L 33/56; H01L 51/5271; H01L 51/5293; H01L 51/5284; H01L 51/5036; H01L 2933/0025; H01L 2933/0041; H01L 2933/005; H01L 2933/0058; H01L 2933/0083; H01L 2933/0091; H01L 25/167; G09F 9/33

USPC .......... 257/88, 89, 98, 99, 100; 438/26, 127
See application file for complete search history.

(56) References Cited

U.S. PATENT DOCUMENTS

| | | |
|---|---|---|
| 8,518,754 B2 | 8/2013 | Takagi et al. |
| 10,020,205 B2 | 7/2018 | You et al. |
| 2006/0244688 A1 | 11/2006 | Ahn |
| 2007/0190887 A1* | 8/2007 | Sato .................... H01L 27/3276 |
| | | 445/24 |
| 2010/0102335 A1 | 4/2010 | Takagi et al. |
| 2011/0291549 A1 | 12/2011 | Kim et al. |
| 2011/0291550 A1 | 12/2011 | Kim et al. |
| 2012/0202400 A1 | 8/2012 | Takagi et al. |
| 2017/0005155 A1 | 1/2017 | You et al. |
| 2017/0194415 A1* | 7/2017 | Choi .................... H01L 51/0096 |
| 2018/0174519 A1* | 6/2018 | Kim ........................ H01L 33/42 |

\* cited by examiner

DISPLAY DEVICE

CROSS REFERENCE TO RELATED APPLICATION

This application claims the priority benefit of Taiwan application serial no. 107124532, filed on Jul. 16, 2018. The entirety of the above-mentioned patent application is hereby incorporated by reference herein and made a part of specification.

BACKGROUND

Technical Field

The present invention relates to a display device, and more particularly to the display device including three light emitting diodes electrically connected to four conductive structures.

Description of Related Art

A light emitting diode (LED) is a kind of light-emitting element, and is suitable for constructing a pixel structure of a light emitting diode display panel due of its low power consumption, high brightness, high resolution, and high color saturation.

A technique of transporting light emitting diodes to a driving backplane having a pixel circuit is called a mass transfer. However, in the prior art, when light-emitting diodes are being transferred, a part of the light emitting diodes is required to rotate to match the configuration of the pixel circuit, making the technique vulnerable to the transposition errors of the light emitting diodes that would affect the display quality of the display device. Therefore, there is a need for a solution that can solve such problems.

SUMMARY

The present invention provides a display device capable of improving a problem of transposition errors caused by transpositions of light emitting diodes by a mass transfer technique.

At least one embodiment of the present invention provides a display device including a substrate, a first pixel circuit, a second pixel circuit, a third pixel circuit, a protective layer, a first conductive structure, a second conductive structure, a third conductive structure, a plurality of first light emitting diodes, a plurality of second light emitting diodes, and a plurality of third light emitting diodes. The first pixel circuit, the second pixel circuit, and the third pixel circuit are located on the substrate. The second pixel circuit is located between the first pixel circuit and the third pixel circuit. The protective layer covers the first pixel circuit, the second pixel circuit, and the third pixel circuit. The first conductive structure is electrically connected to the first pixel circuit through a first opening of the protective layer. The second conductive structure is electrically connected to the second pixel circuit through a second opening of the protective layer. The third conductive structure is electrically connected to the third pixel circuit through a third opening of the protective layer. The plurality of first light emitting diodes are overlapped with the first pixel circuit and the second pixel circuit, and are electrically connected to the first conductive structure. The plurality of second light emitting diodes are overlapped with the first pixel circuit and the second pixel circuit, and are electrically connected to the second conductive structure. The plurality of third light emitting diodes are overlapped with the third pixel circuit and electrically connected to the third conductive structure.

One of the objectives of the present invention is to improve a problem of transposition errors caused by transpositions of light emitting diodes by a mass transfer technique.

One of the objectives of the present invention is to reduce the impedance in a display device.

The features and advantages of the present invention described above will be more apparent from the following descriptions.

DESCRIPTION OF THE EMBODIMENTS

Figure 1B:
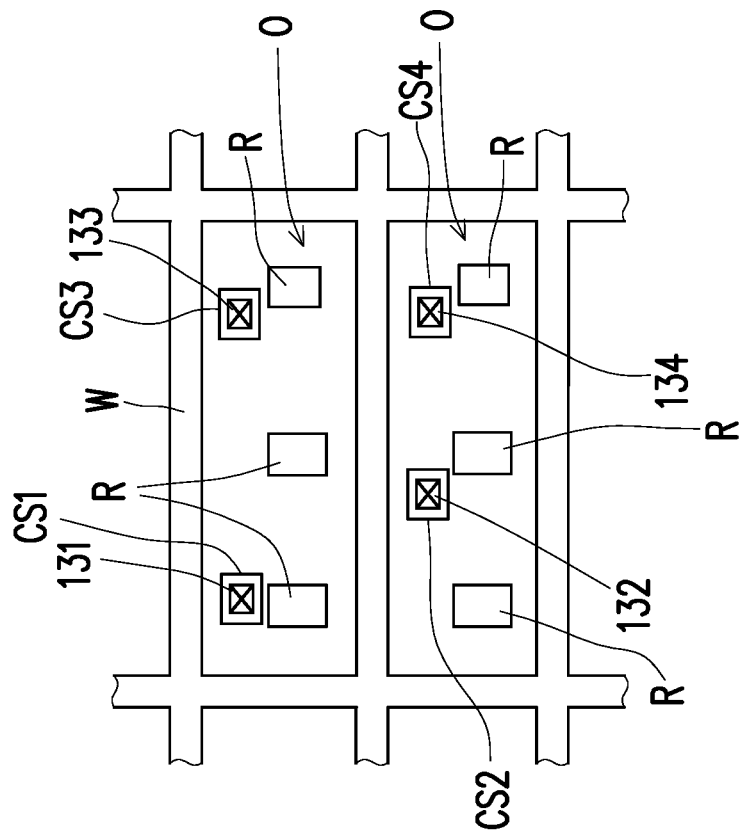
FIGS. 1A-1F are schematic top views of some components of a display device in accordance with an embodiment of the invention.

The present invention will be described more fully hereinafter with the accompanying drawings, and the exemplary embodiments of the present invention are shown in the drawings. As will be appreciated by those skilled in the art, the described embodiments may be modified in a variety of different ways without departing from the spirit or scope of the invention.

Unless otherwise defined, all terms (including technical and scientific terms) used for this invention herein have meanings commonly understood by one having ordinary skill in the art. It should be further understood that the terms used in the context of the related art and the present invention can be interpreted with meanings found in the commonly used dictionaries, and should not be construed to certain meanings unless explicitly defined herein.

Exemplary embodiments are described with ideal schematic or cross-sectional illustrations. Thus, shape alterations as a result of, for example, manufacturing techniques and/or tolerances are something to consider, and the illustrated regions of the embodiments described herein should not be construed to particular shapes. For example, regions shown or described as being flat may generally have rough and/or non-linear features. Furthermore, the acute angles shown may be round. Therefore, the regions illustrated in the figures are only schematic representations and are not intended to illustrate the exact shapes of the regions or to limit the scope of the claims.

FIGS. 1A-1F are schematic top views of some components of a display device in accordance with an embodiment of the invention. FIG. 2A is a schematic cross-sectional view showing a part of the components of the display device according to the section line A-A' of FIG. 1C. FIG. 2B is a schematic cross-sectional view of the display device taken along line B-B' of FIG. 1E. FIG. 2C is a schematic circuit diagram of a pixel circuit in accordance with an embodiment of the invention.

Referring to FIGS. 1A-1E and FIG. 2B, the display device 10 includes a substrate 110, a first pixel circuit PC1, a second pixel circuit PC2, a third pixel circuit PC3, a protective layer 130, a first conductive structure CS1, a second conductive structure CS2, a third conductive structure CS3, a plurality of first light emitting diodes LED1, a plurality of second light emitting diodes LED2, and a plurality of third light emitting diodes LED3. In this embodiment, the display device 10 further includes a fourth conductive structure CS4, a wire W, a reflective layer R, an insulating layer 140, an adhesive layer 150, a first conductive oxide CO1, a second conductive oxide CO2, a third conductive oxide CO3, a fourth conductive oxide CO4, a fifth conductive oxide CO5, a sixth conductive oxide CO6, a seventh conductive oxide CO7, an eighth conductive oxide CO8, a conductive layer CL1, and a conductive layer CL2, but the invention is not limited thereto.

Referring to FIGS. 1A-1C and FIG. 2A, the first pixel circuit PC1, the second pixel circuit PC2, and the third pixel circuit PC3 are located on the substrate 110. The second pixel circuit PC2 is located between the first pixel circuit PC1 and the third pixel circuit PC3. The first pixel circuit PC1, the second pixel circuit PC2, and the third pixel circuit PC3 each includes an element 120, a gate insulating layer GI, an active device T, and an interlayer dielectric layer ILD, but the invention is not limited thereto. In some embodiments, the first pixel circuit PC1, the second pixel circuit PC2, and the third pixel circuit PC3 each also includes other driving components (not shown), but the invention is not limited thereto.

Referring to FIG. 2A, the active device T is located on the substrate 110. The active device T has a channel CH, a gate G, a source S, and a drain D. The channel CH is located on the substrate 110. The channel CH may be a single layer or a multilayer structure, and the material thereof comprises amorphous silicon, nanocrystalline silicon, microcrystalline silicon, polycrystalline silicon, single crystal silicon, oxide semiconductor material, organic semiconductor material, carbon nanotube/rod, perovskite material, or other suitable semiconductor material.

The gate G is overlapped with the channel CH, and the gate insulating layer GI is interposed between the gate G and the channel CH. The material of the gate G is a conductive material. For example, the material of the gate G includes copper (Cu), molybdenum (Mo), titanium (Ti), aluminum (Al), tungsten (W), silver (Ag), gold (Au), an alloy of the above metals or a combination of the above. The gate G may be a single layer structure or a multilayer structure.

The conductive layer 122 is located on the substrate 110. The gate insulating layer GI simultaneously covers the substrate 110, the channel CH, and the conductive layer 122. The channel CH and the conductive layer 122 are located between the gate insulating layer GI and the substrate 110. In this embodiment, the conductive layer 122 and the channel CH belong to the same conductive film layer, and the channel CH and the conductive layer 122 are formed in the same patterning process, but the invention is not limited thereto. In other embodiments, the conductive layer 122 may also belong to a different conductive film layer than the channel CH.

The conductive layer 124 is overlapped with the conductive layer 122. The conductive layer 124 is located on the insulating layer GI. In this embodiment, the conductive layer 124 and the gate G belong to the same conductive film layer, and the gate G and the conductive layer 124 are formed in the same patterning process, but the invention is not limited thereto. In other embodiments, the conductive layer 124 may also be a different conductive film layer than the gate G. Conductive layer 122 and conductive layer 124 are, for example, part of element 120. The element 120 is, for example, an active element or a passive element. In the present embodiment, the element 120 is, for example, a capacitor.

The interlayer dielectric layer ILD simultaneously covers the gate insulating layer GI, the gate G, and the conductive layer 124. The gate G and the conductive layer 124 are located between the interlayer dielectric layer ILD and the gate insulating layer GI.

The drain D and the source S are located on the interlayer dielectric layer ILD and are electrically connected to the channel CH. The drain D is electrically connected to the conductive layer 124. In the present embodiment, the active device T is exemplified by a top gate type thin film transistor, but the present invention is not limited thereto. According to other embodiments, the active device T described above may also be a bottom gate type thin film transistor.

Figure 2A:
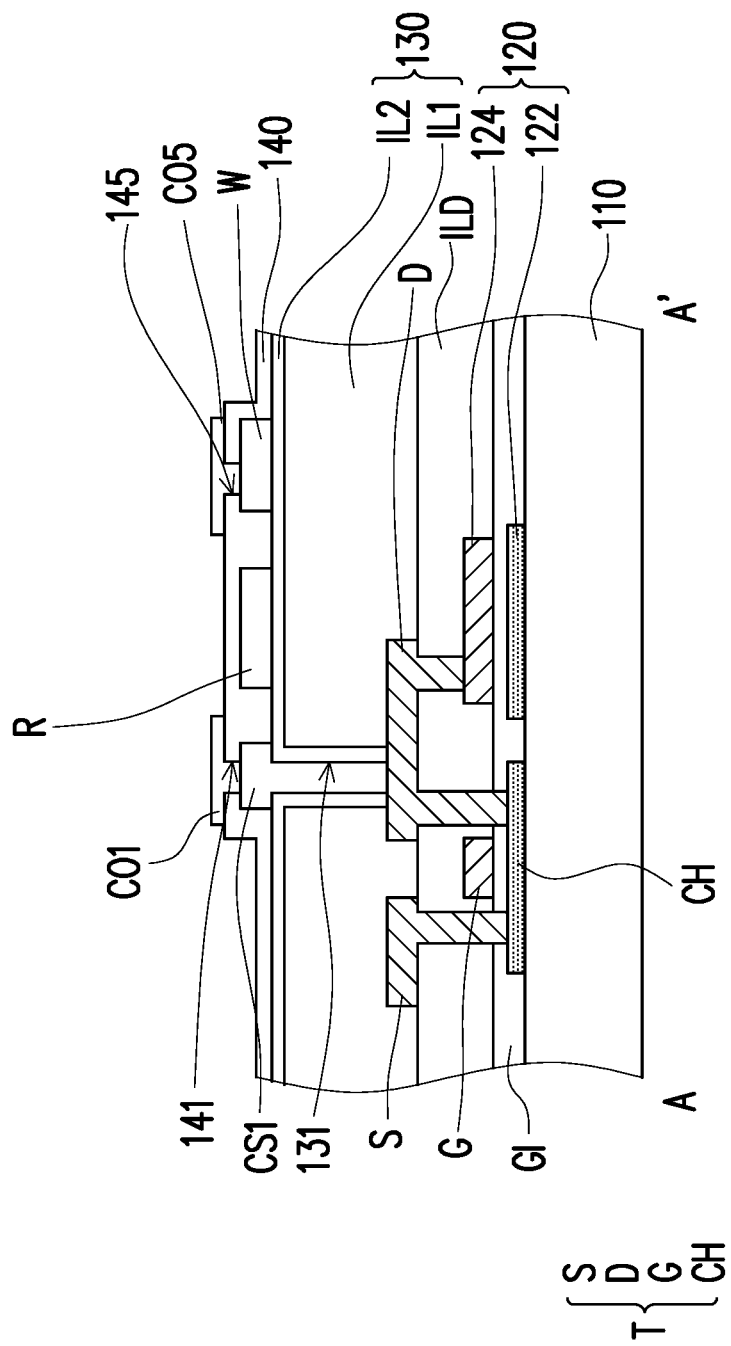
FIG. 2A is a schematic cross-sectional view showing a part of the components of the display device according to the section line A-A' of FIG. 1C.
Figure 2B:
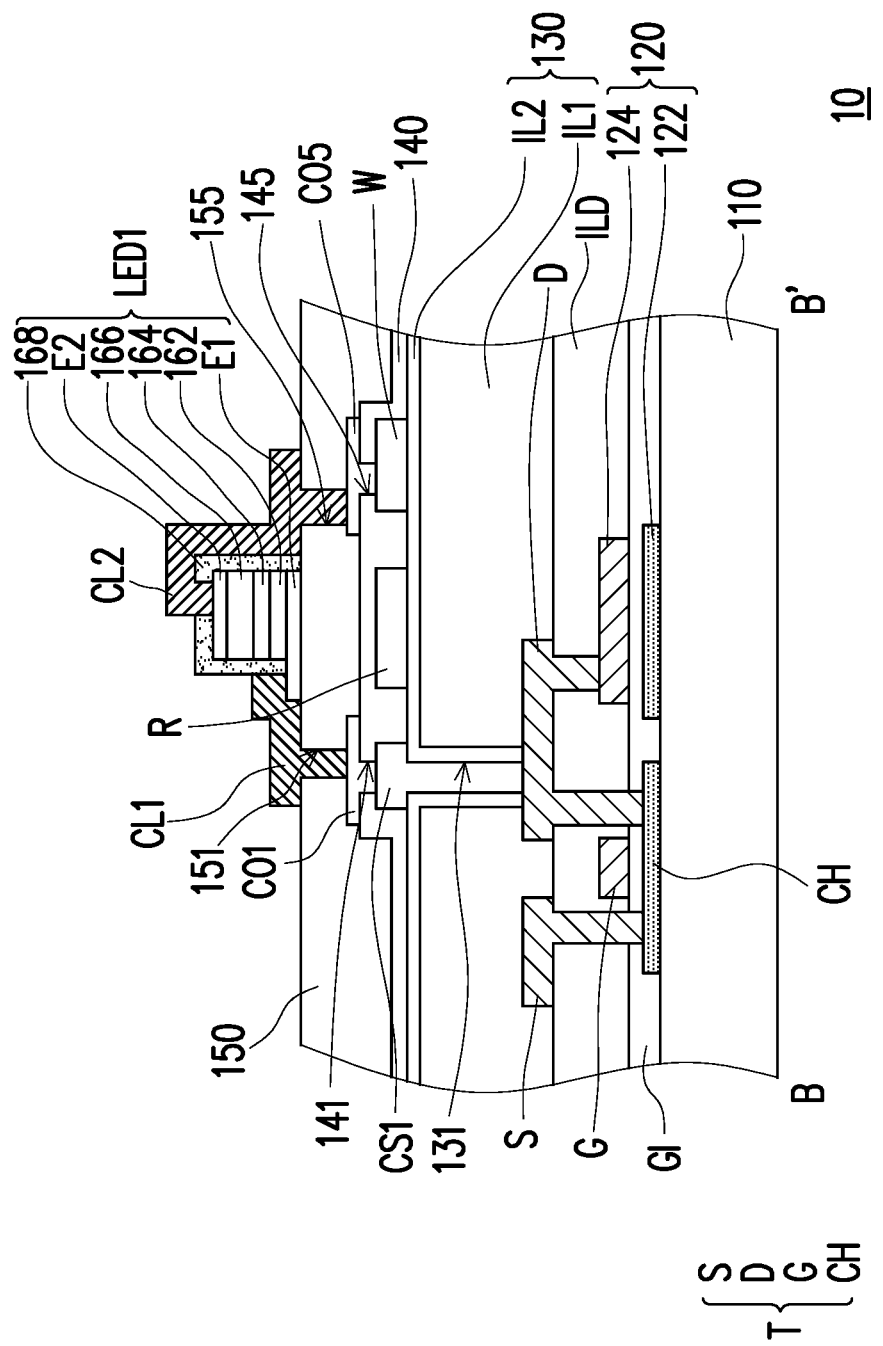
FIG. 2B is a schematic cross-sectional view of the display device taken along line B-B' of FIG. 1E.
Figure 2C:
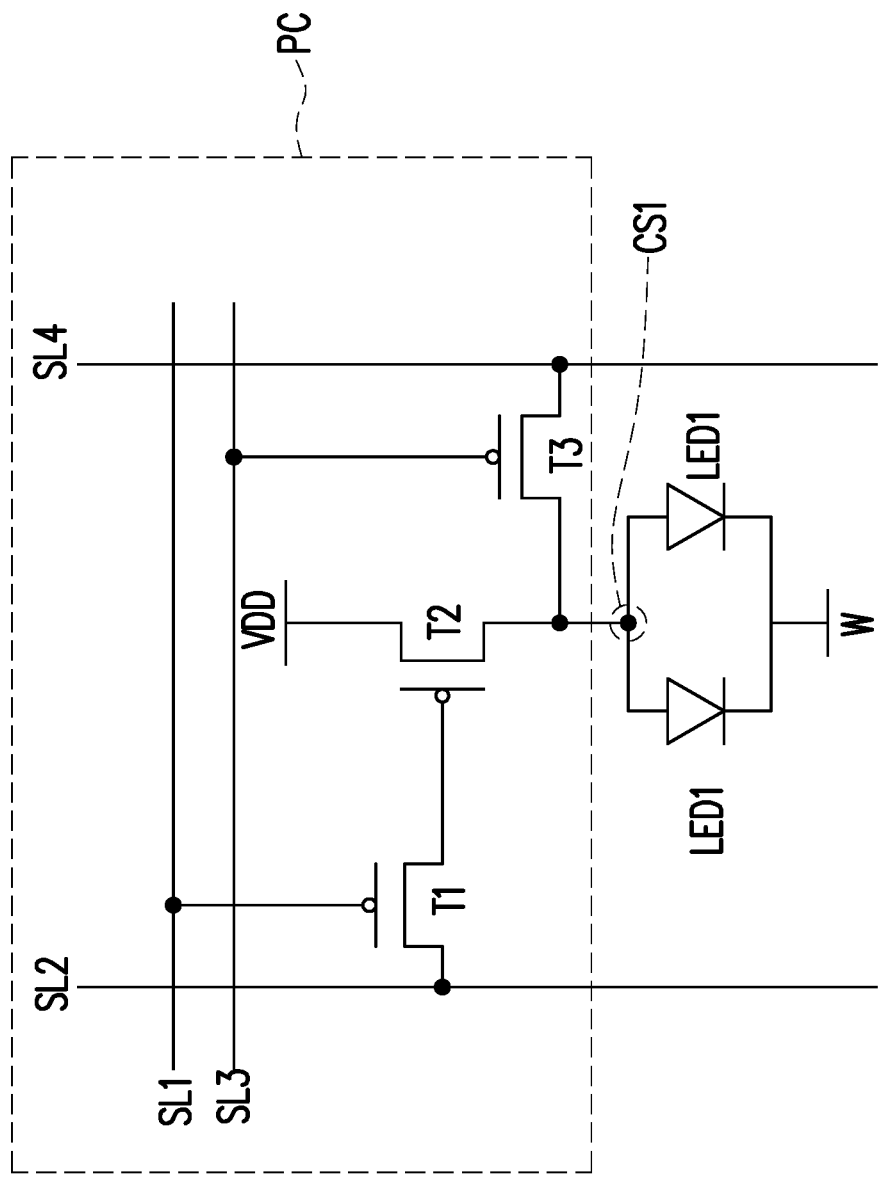
FIG. 2C is a schematic circuit diagram of a pixel circuit in accordance with an embodiment of the invention.

Referring to FIG. 1B and FIG. 2A, the protective layer 130 covers the first pixel circuit PC1, the second pixel circuit PC2, and the third pixel circuit PC3. The protective layer 130 has a first opening 131, a second opening 132 and a third opening 133. In the embodiment, the protective layer 130 further has a fourth opening 134. The protective layer 130 may be an organic material or an inorganic material. The material of the protective layer 130 comprises an inorganic material (for example: silicon oxide, silicon nitride, silicon oxynitride, other suitable materials or a stacked layer of at least two of the above materials), an organic material (for example: polyester (PET), polyene, polypropylene, polycarbonate, polyalkylene oxide, polyphenylene, polyether, polyketone, polyols, polyaldehyde, other suitable materials or combinations of the above), other suitable materials or combinations of the above. In the present embodiment, the protective layer 130 includes a first insulating layer IL1 and a second insulating layer IL2, but the invention is not limited thereto.

The first conductive structure CS1, the second conductive structure CS2, the third conductive structure CS3, and the fourth conductive structure CS4 are located on the protective layer 130. The first conductive structure CS1 is electrically connected to the first pixel circuit PC1 through the first opening 131 of the protective layer 130. The second conductive structure CS2 is electrically connected to the second pixel circuit PC2 through the second opening 132 of the protective layer 130. The third conductive structure CS3 is electrically connected to the third pixel circuit PC3 through the third opening 133 of the protective layer 130. The fourth conductive structure CS4 is electrically connected to the third pixel circuit PC3 through the fourth opening 134 of the protective layer 130.

The wire W is located on the first pixel circuit PC1, the second pixel circuit PC2, and the third pixel circuit PC3. The wire W is a mesh structure having a plurality of apertures O. In this embodiment, the wire W, the first conductive structure CS1, the second conductive structure CS2, the third conductive structure CS3, and the fourth conductive structure CS4 belong to the same conductive film layer, and in addition, the wire W, the first conductive structure CS1, the second conductive structure CS2, the third conductive structure CS3, and the fourth conductive structure CS4 are formed in the same patterning process, but the invention is not limited thereto.

The reflective layer R is located in the apertures O of the wire W. In this embodiment, the reflective layer R is structurally separated from the wire W, the first conductive structure CS1, the second conductive structure CS2, the third conductive structure CS3, and the fourth conductive structure CS4, but the invention is not limited thereto. In some embodiments, the reflective layer R can be electrically connected to at least one of the wire W, the first conductive structure CS1, the second conductive structure CS2, the third conductive structure CS3, or the fourth conductive structure CS4.

Figure 1A:
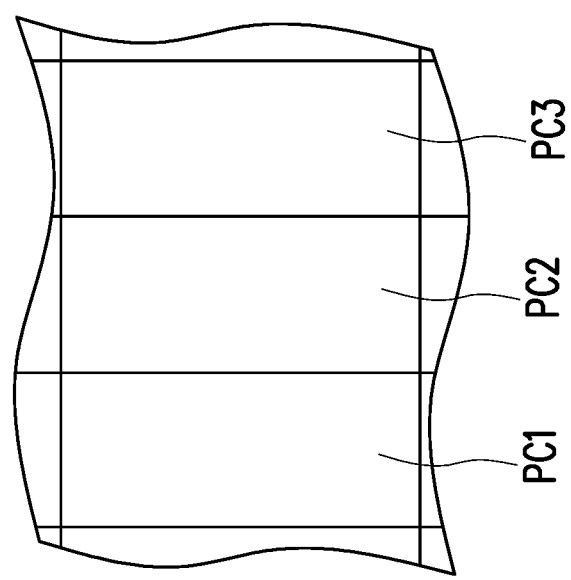
Figure 1C:
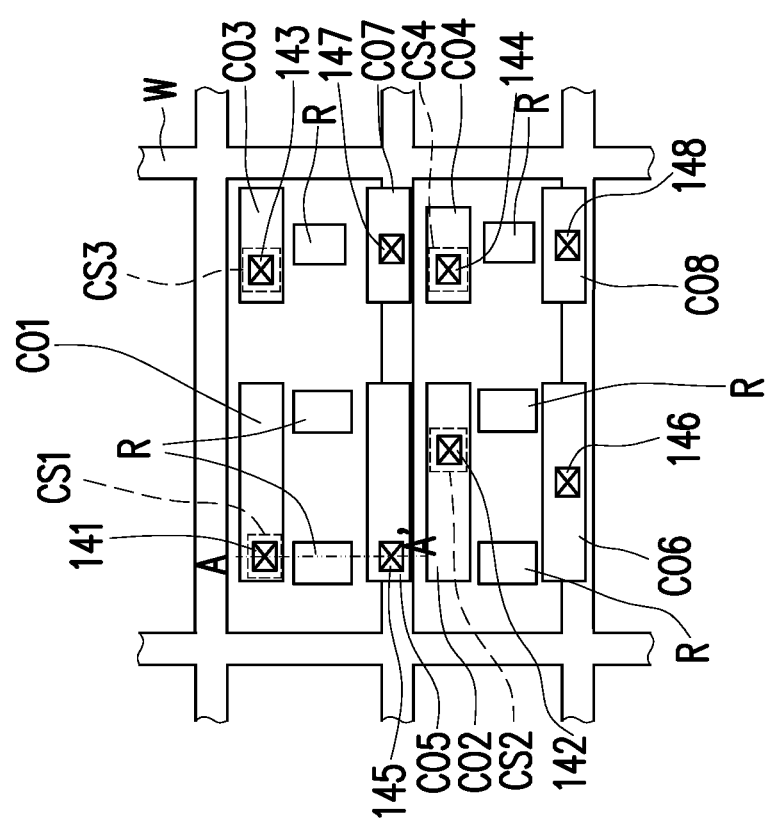

Referring to FIG. 1C and FIG. 2A, the insulating layer 140 covers the first conductive structure CS1, the second conductive structure CS2, the third conductive structure CS3, the fourth conductive structure CS4, and the protective layer 130. The insulating layer 140 has a first hole 141, a second hole 142, a third hole 143, a fourth hole 144, a fifth hole 145, a sixth hole 146, a seventh hole 147, and an eighth hole 148.

The first conductive oxide CO1, the second conductive oxide CO2, the third conductive oxide CO3, the fourth conductive oxide CO4, the fifth conductive oxide CO5, the sixth conductive oxide CO6, and the seventh conductive oxide CO7 and the eighth conductive oxide CO8 are located on the insulating layer 140.

The first conductive oxide CO1 is electrically connected to the first conductive structure CS1 through the first hole 141 of the insulating layer 140. The second conductive oxide CO2 is electrically connected to the second conductive structure CS2 through the second hole 142 of the insulating layer 140. The third conductive oxide CO3 is electrically connected to the third conductive structure CS3 through the third hole 143 of the insulating layer 140. The fourth conductive oxide CO4 is electrically connected to the fourth conductive structure CS4 through the fourth hole 144 of the insulating layer 140.

The fifth conductive oxide CO5 is electrically connected to the wire W through the fifth hole 145 of the insulating layer 140. The sixth conductive oxide CO6 is electrically connected to the wire W through the sixth hole 146 of the insulating layer 140. The seventh conductive oxide CO7 is electrically connected to the wire W through the seventh hole 147 of the insulating layer 140. The eighth conductive oxide CO8 is electrically connected to the wire W through the eighth hole 148 of the insulating layer 140.

Figure 1D:
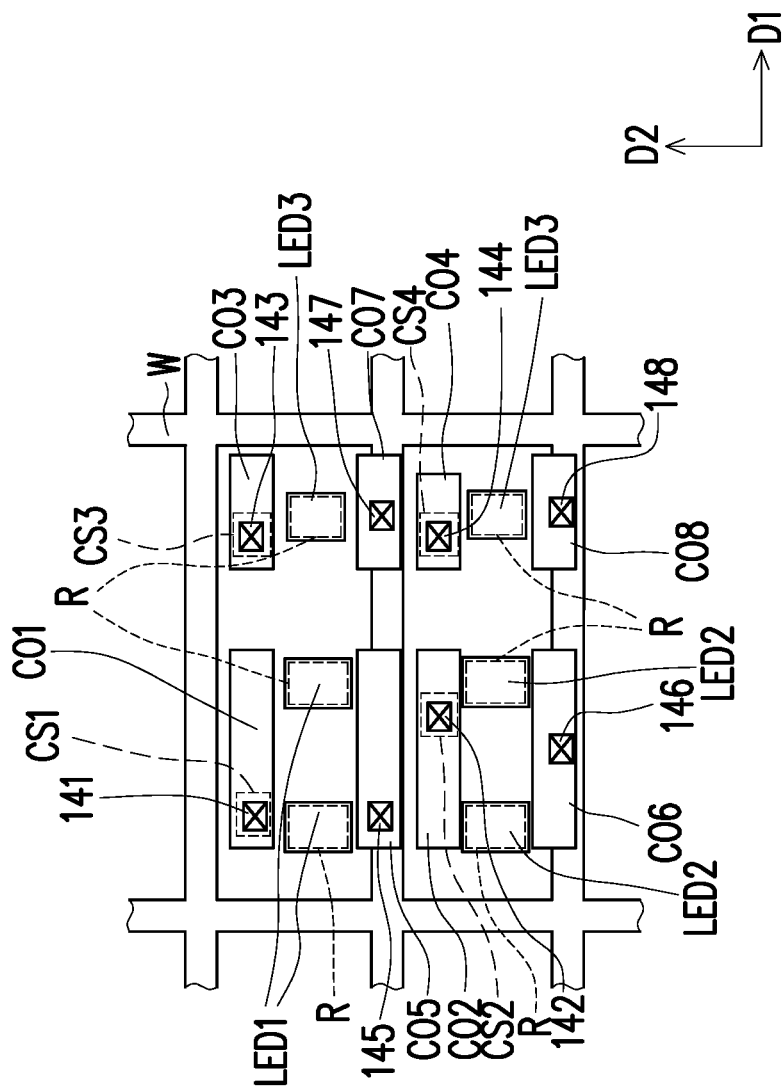

Referring to FIG. 1A and FIG. 1D, the plurality of first light emitting diodes LED1 are overlapped with the first pixel circuit PC1 and the second pixel circuit PC2. The plurality of second light emitting diodes LED2 are overlapped with the first pixel circuit PC1 and the second pixel circuit PC2. The plurality of third light emitting diode LED3 are overlapped with the third pixel circuit PC3.

The first light emitting diodes LED1, the second light emitting diodes LED2, and the third light emitting diodes LED3 are disposed corresponding to the plurality of apertures O of the wire W. The first light emitting diodes LED1 are arranged along a first direction D1. The second light emitting diodes LED2 are arranged along the first direction D1. The third light emitting diodes LED3 are arranged along a second direction D2. The first direction D1 is different from the second direction D2.

In some embodiments, a vertical projection of at least a portion of the wire W on the substrate 110 is located between a vertical projection of the first light emitting diodes LED1 on the substrate 110 and a vertical projection of the second light emitting diodes LED2 on the substrate 110. A vertical projection of at least a portion of the wire W on the substrate 110 is located between the vertical projections of two adjacent third light emitting diodes LED3 on the substrate 110. A vertical projection of at least a portion of the wire W on the substrate 110 is overlapped with the first pixel circuit PC1 and the second pixel circuit PC2. In the present embodiment, the wire W is not disposed between the two adjacent first light emitting diodes LED1 and the two adjacent light emitting diodes LED2, but the invention is not limited thereto. In other embodiments, the wire W may be disposed between two adjacent first light emitting diodes LED1 and/or between two adjacent second light emitting diodes LED2.

Referring to FIG. 1D and FIG. 2B, in the embodiment, the adhesive layer 150 covers the insulating layer 140, the first conductive oxide CO1, the second conductive oxide CO2, the third conductive oxide CO3, the fourth conductive CO4, the fifth conductive oxide CO5, the sixth conductive oxide CO6, the seventh conductive oxide CO7, and the eighth conductive oxide CO8. The first conductive oxide CO1, the second conductive oxide CO2, the third conductive oxide CO3, the fourth conductive oxide CO4, the fifth conductive oxide CO5, the sixth conductive oxide CO6, they seventh conductive oxide CO7, and the eighth conductive oxide CO8 are located between the adhesive layer 150 and the insulating layer 140. The adhesive layer 150 has a plurality of through holes 151 to 158.

The adhesive layer 150 is disposed between the first light emitting diode LED1 and the protective layer 130, between the second light emitting diode LED2 and the protective layer 130, and between the third light emitting diode LED3 and the protective layer 130.

In the present embodiment, the first light emitting diode LED1, the second light emitting diode LED2, and the third light emitting diode LED3 are located on the adhesive layer 150. The first light emitting diode LED1, the second light emitting diode LED2, and the third light emitting diode LED3 are formed, for example, on a growth substrate, and then transferred onto the adhesive layer 150 by a massive transfer technique. In the present embodiment, the first light emitting diode LED1, the second light emitting diode LED2, and the third light emitting diode LED3 may be affixed to the adhesive bonding layer 150 by physical or chemical means, but the invention is not limited thereto. In other embodiments, the first light emitting diode LED1, the second light emitting diode LED2, and the third emitting diode LED3 can be electrically connected to the electrode pads on the substrate through, for example, solder.

In some embodiments, the adhesive layer 150 includes a cured photoresist material. In some embodiments, the photoresist material is applied over the protective layer 130, and the first light emitting diode LED1, the second light emitting diode LED2, and the third light emitting diode LED3 are placed on the photoresist material, and then the photoresist material is cured. More specifically, in some embodiments, the photoresist material is applied over the insulating layer 140, and the first light emitting diode LED1, the second light emitting diode LED2, and the third light emitting diode LED3 are placed on the photoresist material, and then the photoresist material is cured. Then, the through holes 151 to 158 are formed on the photoresist material by means of lithography, but the invention is not limited thereto.

Figure 1E:
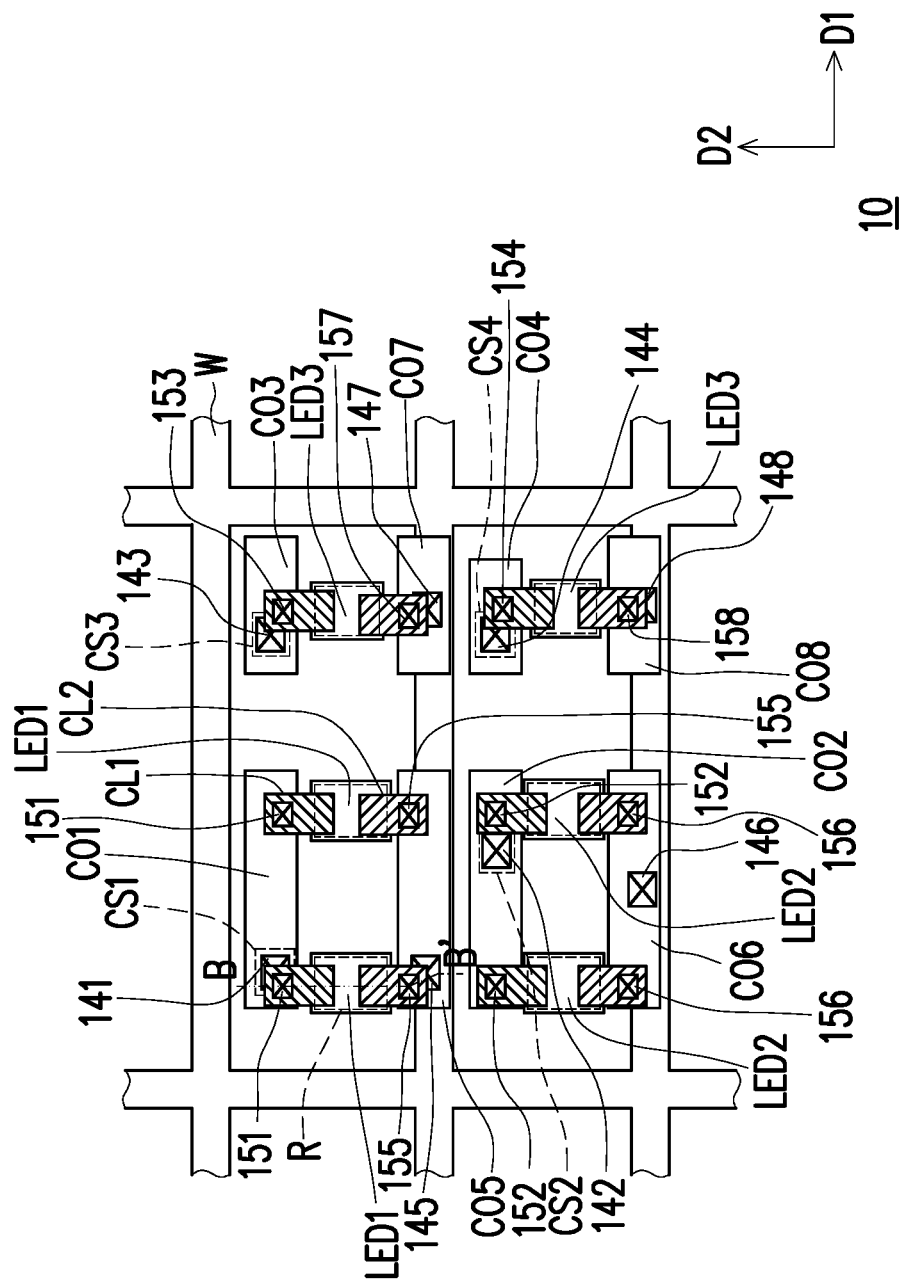

Referring to FIG. 1E and FIG. 2B, in the embodiment, each of the first light emitting diodes LED1, the second light emitting diodes LED2, and the third light emitting diodes LED3 transferred onto the adhesive layer 150 includes a first electrode E1, a first semiconductor layer 162, a light emitting layer 164, a second semiconductor layer 166, a second electrode E2, and an insulating layer 168 are sequentially stacked.

The vertical projection of the first electrode E1 of each of the first light emitting diodes LED1, the second light emitting diodes LED2, and the third light emitting diodes LED3 on the substrate 110 protrudes from the vertical projection of the respective first semiconductor layer 162 of each of the first light emitting diodes LED1, the second light emitting diodes LED2, and the third light emitting diodes LED3 on the substrate 110.

The first electrode E1 of each of the first light emitting diodes LED1, the second light emitting diodes LED2, and the third light emitting diodes LED3 are electrically connected to the conductive layer CL1. The conductive layer CL1 is electrically connected to the first conductive oxide CO1, the second conductive oxide CO2, the third conductive oxide CO3, and the fourth conductive oxide CO4 through the plurality of through holes 151-154 of the adhesive layer 150. Specifically, the conductive layer CL1 electrically connected to the plurality of first light emitting diodes LED1 is electrically connected to the first conductive oxide CO1 through the through hole 151 of the adhesive layer 150; the conductive layer CL1 electrically connected to the plurality of second light emitting diodes LED2 is electrically connected to the second conductive oxide CO2 through the through hole 152 of the adhesive layer 150; the conductive layer CL1 electrically connected to a portion of the third light emitting diodes LED3 is electrically connected to the third conductive oxide CO3 through the through hole 153 of the adhesive layer 150; the conductive layer CL1 electrically connected to another portion of the third light emitting diodes LED3 is electrically connected to the fourth conductive oxide CO4 through the through hole 154 of the adhesive layer 150.

The first electrodes E1 of the plurality of first light emitting diodes LED1 are electrically connected to the first conductive structure CS1. The first electrodes E1 of the plurality of second light emitting diodes LED2 are electrically connected to the second conductive structure CS2. The first electrode E1 of the portion of the third light emitting diode LED3 is electrically connected to the third conductive structure CS3. The first electrode E1 of the other portion of the third light emitting diode LED3 is electrically connected to the fourth conductive structure CS4. In some embodiments, the plurality of third light emitting diodes LED3 are simultaneously electrically connected to the third conductive structure CS3 and the fourth conductive structure CS4, and the third conductive structure CS3 and the fourth conductive structure CS4 are applied with the same signal.

In the present embodiment, the insulating layer 168 has at least one opening to expose a portion of the top surface of the second electrode E2. The second electrodes E2 of each of the first light emitting diodes LED1, the second light emitting diodes LED2, and the third light emitting diodes LED3 are electrically connected to the conductive layer CL2 respectively. The conductive layer CL2 is electrically connected to the fifth conductive oxide CO5, the sixth conductive oxide CO6, the seventh conductive oxide CO7, and the eighth conductive oxide CO8 through the plurality of through holes 155-158 of the adhesive layer 150. Specifically, the conductive layer CL2 electrically connected to the plurality of first light emitting diodes LED1 is electrically connected to the fifth conductive oxide CO5 through the through hole 155 of the adhesive layer 150; the conductive layer CL2 electrically connected to the plurality of second light emitting diodes LED2 is electrically connected to the sixth conductive oxide CO6 through the through hole 156 of the adhesive layer 150; the conductive layer CL2 electrically connected to a portion of the third light emitting diode LED3 is electrically connected to the seventh conductive oxide CO7 through the through hole 157 of the adhesive layer 150; the conductive layer CL2 electrically connected to another portion of the third light emitting diode LED3 is electrically connected to the eighth conductive oxide CO8 through the through hole 158 of the adhesive layer 150.

The first light emitting diodes LED1, the second light emitting diodes LED2, and the third light emitting diodes LED3 are electrically connected to the wire W.

The first electrodes E1 and the second electrodes E2 of the first light emitting diodes LED1 are respectively electrically connected to the first conductive oxide CO1 and the fifth conductive oxide CO5. The vertical projection of the first conductive oxide CO1 on the substrate 110 is on a first side of the vertical projection of the first light emitting diodes LED1 on the substrate 110. The vertical projection of the fifth conductive oxide CO5 on the substrate 110 is located on a second side of the vertical projection of the first light emitting diodes LED1 on the substrate 110.

The first electrodes E1 and the second electrodes E2 of the second light emitting diodes LED2 are electrically connected to the second conductive oxide CO2 and the sixth conductive oxide CO6, respectively. The vertical projection of the second conductive oxide CO2 on the substrate 110 is on a first side of the vertical projection of the second light emitting diodes LED2 on the substrate 110. The vertical projection of the sixth conductive oxide CO6 on the substrate 110 is located on a second side of the vertical projection of the second light emitting diodes LED2 on the substrate 110. The first conductive oxide CO1, the fifth conductive oxide CO5, the second conductive oxide CO2 and the sixth conductive oxide CO6 are sequentially arranged, for example, sequentially arranged along the second direction D2.

The third light emitting diodes LED3 are electrically connected to the third conductive oxide CO3, the fourth conductive oxide CO4, the seventh conductive oxide CO7, and the eighth conductive oxide CO8. For example, the first electrode E1 and the second electrode E2 of the portion of the third light emitting diodes LED3 are electrically connected to the third conductive oxide CO3 and the seventh conductive oxide CO7, respectively; and the first electrode E1 and the second electrode E2 of the other portion of the third light emitting diodes LED3 are electrically connected to the fourth conductive oxide CO4 and the eighth conductive oxide CO8, respectively. The third conductive oxide CO3, the seventh conductive oxide CO7, the fourth conductive oxide CO4, and the eighth conductive oxide CO8 are sequentially arranged, for example, sequentially arranged along the second direction D2.

Figure 1F:
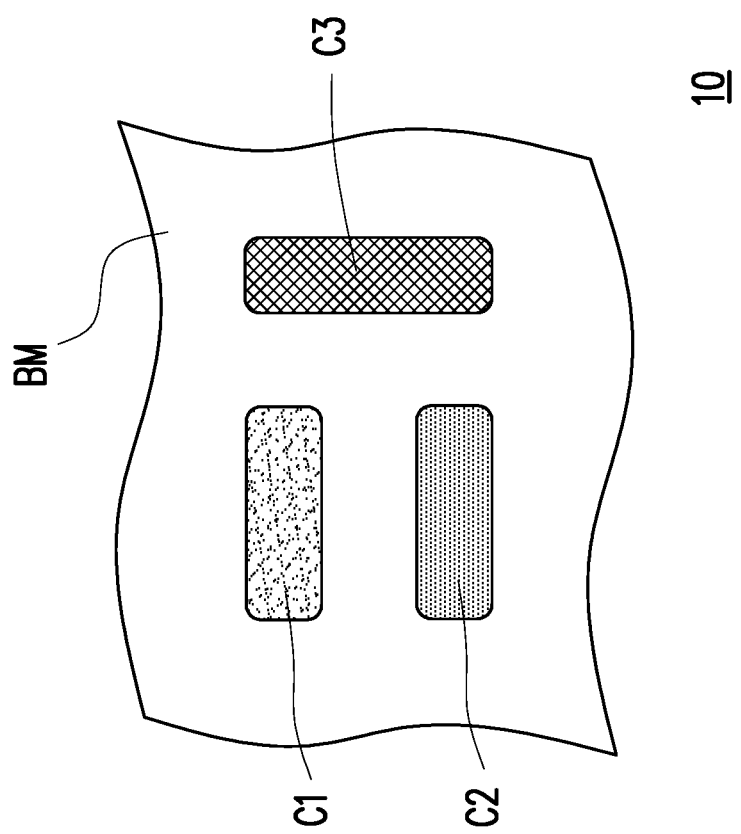

Referring to FIG. 1F, in some embodiments, display device 10 further includes a color conversion panel. The color conversion panel includes color conversion elements C1 to C3 and a light shielding element BM. The color conversion elements C1 to C3 are, for example, color filter elements, fluorescent materials, and/or quantum dot materials. The color conversion elements C1 to C3 are, for example, color conversion elements of different colors, for example, red, green, and blue, respectively. The color conversion element C1 is overlapped with the first light emitting diode LED1. The color conversion element C2 is overlapped with the second light emitting diode LED2. The color conversion element C3 is overlapped with the third light emitting diode LED3. In other words, the color conversion element C1 is disposed corresponding to the first pixel circuit PC1 and the second pixel circuit PC2, the color conversion element C2 is disposed corresponding to the first pixel circuit PC1 and the second pixel circuit PC2, and the color conversion element C3 is disposed corresponding to the third pixel circuit PC3.

In this embodiment, the first electrode E1 of each of the first light emitting diodes LED1, the second light emitting diodes LED2, and the third light emitting diodes LED3 may have the same rotation angle after the transposition of the mass transfer technique. That is, the first light emitting diodes LED1, the second light emitting diodes LED2, and the third light emitting diodes LED3 can be completed in the same transposition process without requiring any one of the first light emitting diodes LED1, second light emitting diodes LED2 or third light emitting diodes LED3 to have a different direction of rotation from the others in order to match the pixel circuit, thereby improving the problem of the transposition error and reducing the impedance in the display device.

FIG. 2C is a schematic circuit diagram of a pixel circuit according to an embodiment of the present invention. The pixel circuit PC is, for example, one of the first pixel circuit PC1, the second pixel circuit PC2 or the third pixel circuit PC3. In this embodiment, the pixel circuit PC is an example of the first pixel circuit PC1.

Referring to FIG. 2C, in the embodiment, the pixel circuit PC includes an active device T1. A gate of the active device T1 is electrically connected to a signal line SL1, a source of the active device T1 is electrically connected to the signal line SL2, and a drain of the active device T1 is electrically connected to a gate of the active device T2. The signal line SL1 is, for example, a scan line, and the signal line SL2 is, for example, a data line.

A source of the active device T2 is electrically connected to the voltage VDD. A drain of the active device T2 and a drain of the active device T3 are electrically connected to one end of the plurality of first light emitting diodes LED1, for example, and the other ends of the plurality of first light emitting diodes LED1 are electrically connected to the wire W. In some embodiments, the wire W is electrically connected to the voltage VSS.

A gate of the active device T3 is electrically connected to a signal line SL3, and a source of the active device T3 is electrically connected to a signal line SL4. The signal line SL3 is, for example, a scan line, and the signal line SL4 is, for example, a data line.

Based on the above, the display device 10 of the present invention can improve the problem of transposition errors caused by the transpositions of the light emitting diodes by a mass transfer technique and reduce the impedance in the display device, thereby improving the display quality of the display device.

Figure 3:
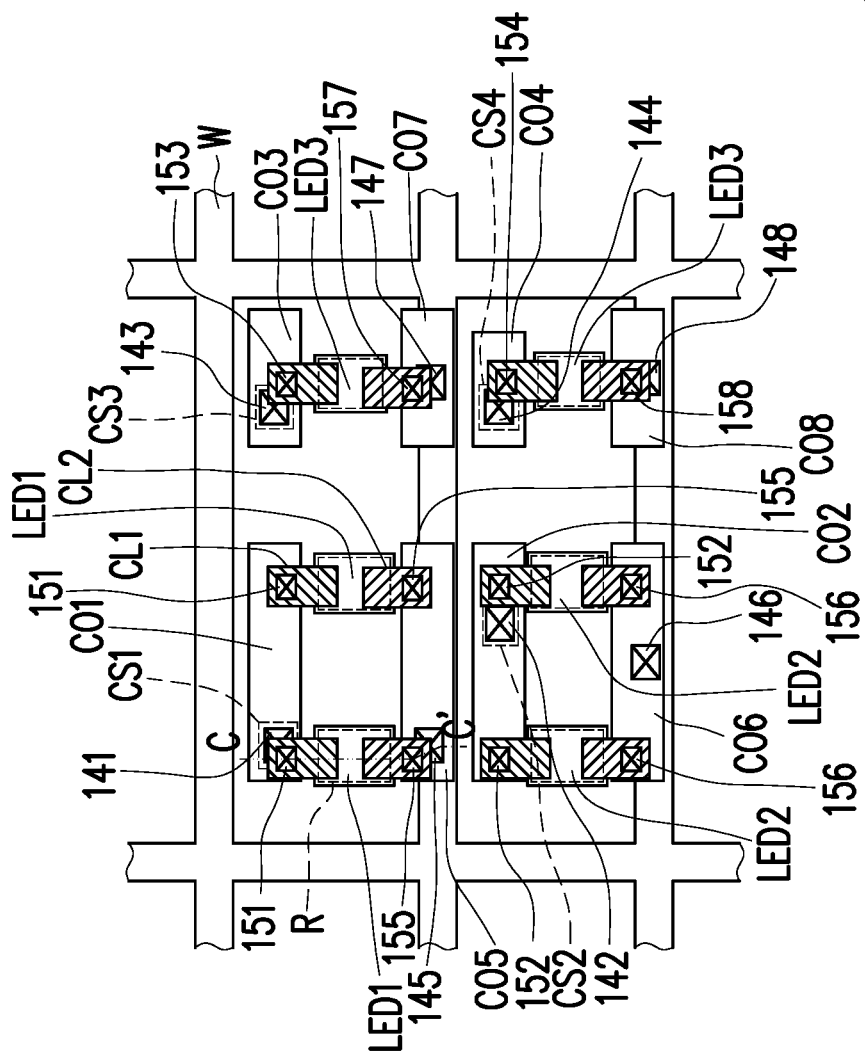
FIG. 3 is a schematic top view of a display device according to another embodiment of the present invention.
Figure 4:
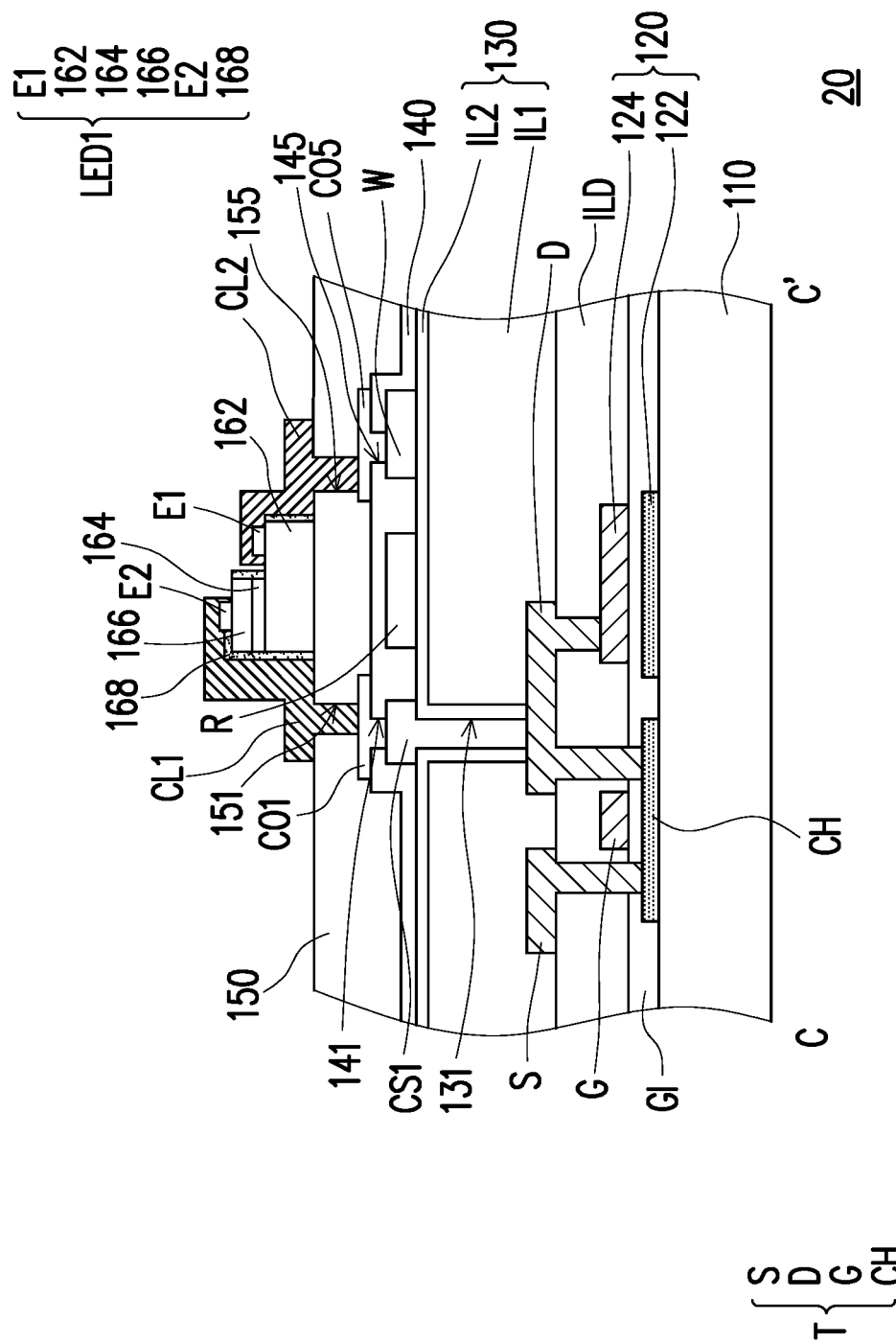
FIG. 4 is a cross-sectional view showing a portion of the components of the display device taken along line C-C' of FIG. 3.

FIG. 3 is a schematic top view of a display device according to another embodiment of the present invention. FIG. 4 is a cross-sectional view showing a portion of the components of the display device taken along line C-C' of FIG. 3. It should be noted that the embodiment of FIGS. 3 and 4 follows the component numbers and parts of the embodiment of FIG. 1E and FIG. 2B, wherein the same or similar reference numerals are used to denote the same or similar elements, and the description of the same technical content is omitted. For the description of the omitted portions, reference may be made to the foregoing embodiments, and the following embodiments are not repeated.

The difference between the embodiment of FIGS. 3 and 4 and the embodiment of FIGS. 1E and 2B is that the types of the light emitting diodes used are different.

Referring to FIG. 3 and FIG. 4, each of the first light emitting diodes LED1, the second light emitting diodes LED2, and the third light emitting diodes LED3 transferred onto the adhesive layer 150 includes a first electrode E1, a first semiconductor layer 162, a light emitting layer 164, a second semiconductor layer 166, a second electrode E2, and an insulating layer 168, wherein the first semiconductor layer 162, the light emitting layer 164, and the second semiconductor layer 166 are sequentially stacked. In the present embodiment, the first light emitting diode LED1, the second light emitting diode LED2, and the third light emitting diode LED3 have a similar structure.

In the present embodiment, the second semiconductor layer 166 is overlapped with a portion of the first semiconductor layer 162. The insulating layer 168 has at least two openings exposing the first electrode E1 and the second electrode E2, respectively.

In the present embodiment, the first electrode E1 and the light emitting layer 164 are located on the same side of the first semiconductor layer 162. In FIG. 4, the first electrode E1 and the light emitting layer 164 are both located on the upper side of the first semiconductor layer 162. The first electrode E1 is electrically connected to the first semiconductor layer 162. The second electrode E2 is electrically connected to the second semiconductor layer 166. The second semiconductor layer 166 is located between the second electrode E2 and the light emitting layer 164.

The second electrode E2 of each of the first light-emitting diodes LED1, the second light-emitting diodes LED2, and the third light-emitting diodes LED3 are electrically connected to the conductive layer CL1, respectively. The conductive layer CL1 is electrically connected to the first conductive oxide CO1, the second conductive oxide CO2, the third conductive oxide CO3, and the fourth conductive oxide CO4 through the plurality of through holes 151-154 of the adhesive layer 150. Specifically, the conductive layer CL1 electrically connected to the plurality of first light emitting diodes LED1 is electrically connected to the first conductive oxide CO1 through the through hole 151 of the adhesive layer 150; the conductive layer CL1 electrically connected to the plurality of second light emitting diodes LED2 is electrically connected to the second conductive oxide CO2 through the through hole 152 of the adhesive layer 150; the conductive layer CL1 electrically connected to the third light emitting diodes LED3 is electrically connected to the third conductive oxide CO3 through the through hole 153 of the adhesive layer 150; the conductive layer CL1 electrically connected to another portion of the third light emitting diodes LED3 is electrically connected to the fourth conductive oxide CO4 through the through hole 154 of the adhesive layer 150.

The first electrode E1 of each of the first light emitting diodes LED1, the second light emitting diodes LED2, and the third light emitting diodes LED3 are electrically connected to the conductive layer CL2, respectively. The conductive layer CL2 is electrically connected to the fifth conductive oxide CO5, the sixth conductive oxide CO6, the seventh conductive oxide CO7, and the eighth conductive oxide CO8 through the plurality of through holes 155-158 of the adhesive layer 150. Specifically, the conductive layer CL2 electrically connected to the plurality of first light emitting diodes LED1 is electrically connected to the fifth conductive oxide CO5 through the through hole 155 of the adhesive layer 150; the conductive layer CL2 electrically connected to the plurality of second light emitting diodes LED2 is electrically connected to the sixth conductive oxide CO6 through the through hole 156 of the adhesive layer 150; the conductive layer CL2 electrically connected to a portion of the third light emitting diodes LED3 is electrically connected to the seventh conductive oxide CO7 through the through hole 157 of the adhesive layer 150; the conductive layer CL1 electrically connected to another portion of the third light emitting diodes LED3 is electrically connected to the eighth conductive oxide CO8 through the through hole 158 of the adhesive layer 150.

In this embodiment, the first electrode E1 of each of the first light emitting diodes LED1, the second light emitting diodes LED2, and the third light emitting diodes LED3 may have the same rotation angle after the transposition of a mass transfer technique. That is, the first light emitting diodes LED1, the second light emitting diodes LED2, and the third light emitting diodes LED3 can be completed in the same transposition process without requiring any one of the first light emitting diodes LED1, second light emitting diodes LED2 or the third light emitting diodes LED3 to have a different rotation direction from the others in order to match the pixel circuit, thereby improving the problem of the transposition error and reducing the impedance in the display device.

Based on the above, the display device 20 of the present invention can improve the problem of transposition errors caused by the transpositions of the light emitting diodes by a mass transfer technique, reduce the impedance in the display device, and improve the display quality of the display device.

Figure 5:
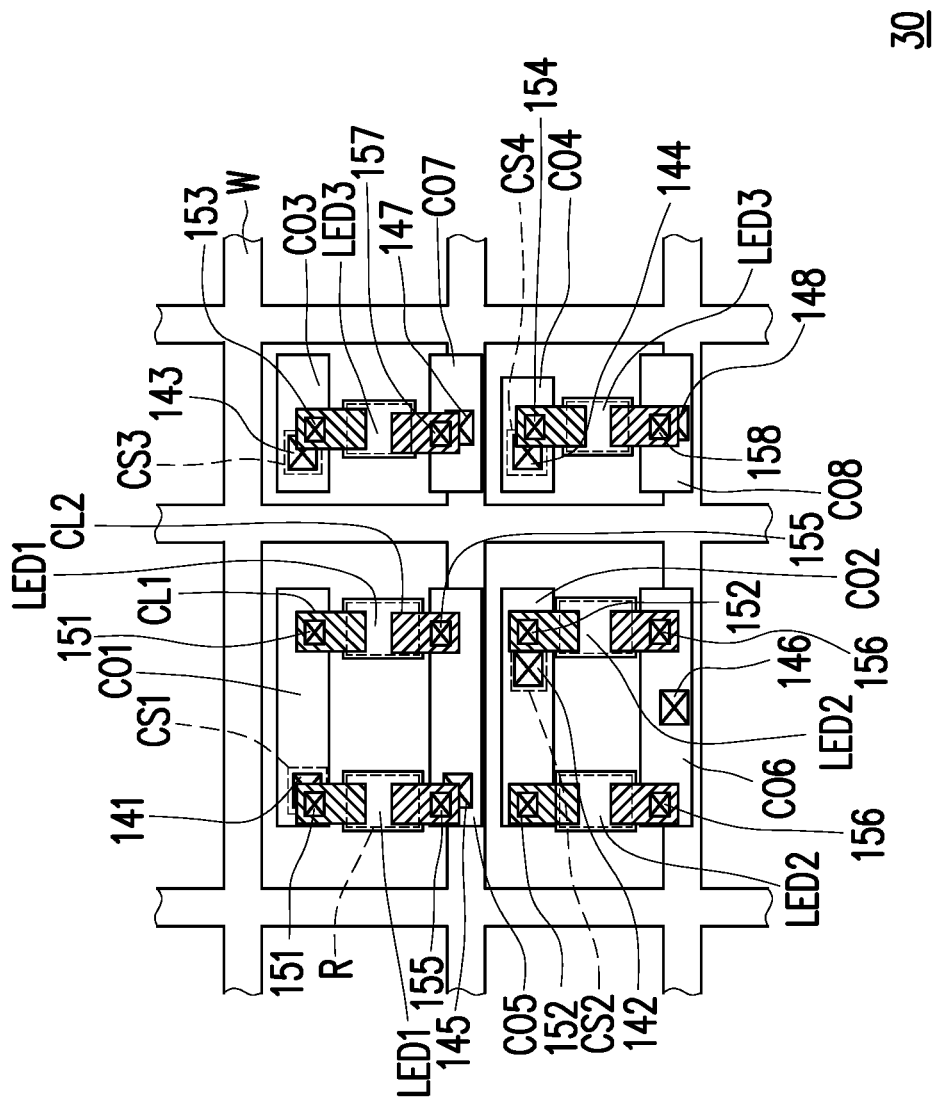
FIG. 5 is a schematic top view of a display device according to another embodiment of the present invention.

FIG. 5 is a schematic top view of a display device according to another embodiment of the present invention. It is to be noted that the embodiment of FIG. 5 follows the same reference numerals and parts of the embodiment of FIG. 1E, wherein the same or similar elements are used to denote the same or similar elements, and the description of the same technical content is omitted. For the description of the omitted portions, reference may be made to the foregoing embodiments, and the following embodiments are not repeated.

The difference between the embodiment of FIG. 5 and the embodiment of FIG. 1E is that the shapes of the wire W are different.

In this embodiment, at least a portion of a vertical projection of the wire W on the substrate 110 is located between the vertical projection of the first light emitting diodes LED1 on the substrate 110 and a vertical projection of the third light emitting diodes LED3 on the substrate 110. A vertical projection of at least a portion of the wire W on the substrate 110 is located between a vertical projection of the second light emitting diodes LED2 on the substrate 110 and a vertical projection of the third light emitting diodes LED3 on the substrate 110. At least a portion of a vertical projection of the wire W on the substrate 110 is located between the first pixel circuit PC1 and the third pixel circuit PC3. A vertical projection of at least a portion of the wire W on the substrate 110 is located between the second pixel circuit PC2 and the third pixel circuit PC3. Thereby, the wire W of the present embodiment can have a lower impedance value.

Based on the above, the display device 30 of the present invention can improve the problem of transposition errors caused by the transpositions of the light emitting diodes by a mass transfer technique and reduce the impedance in the display device, thereby improving the display quality of the display device.

Figure 6:
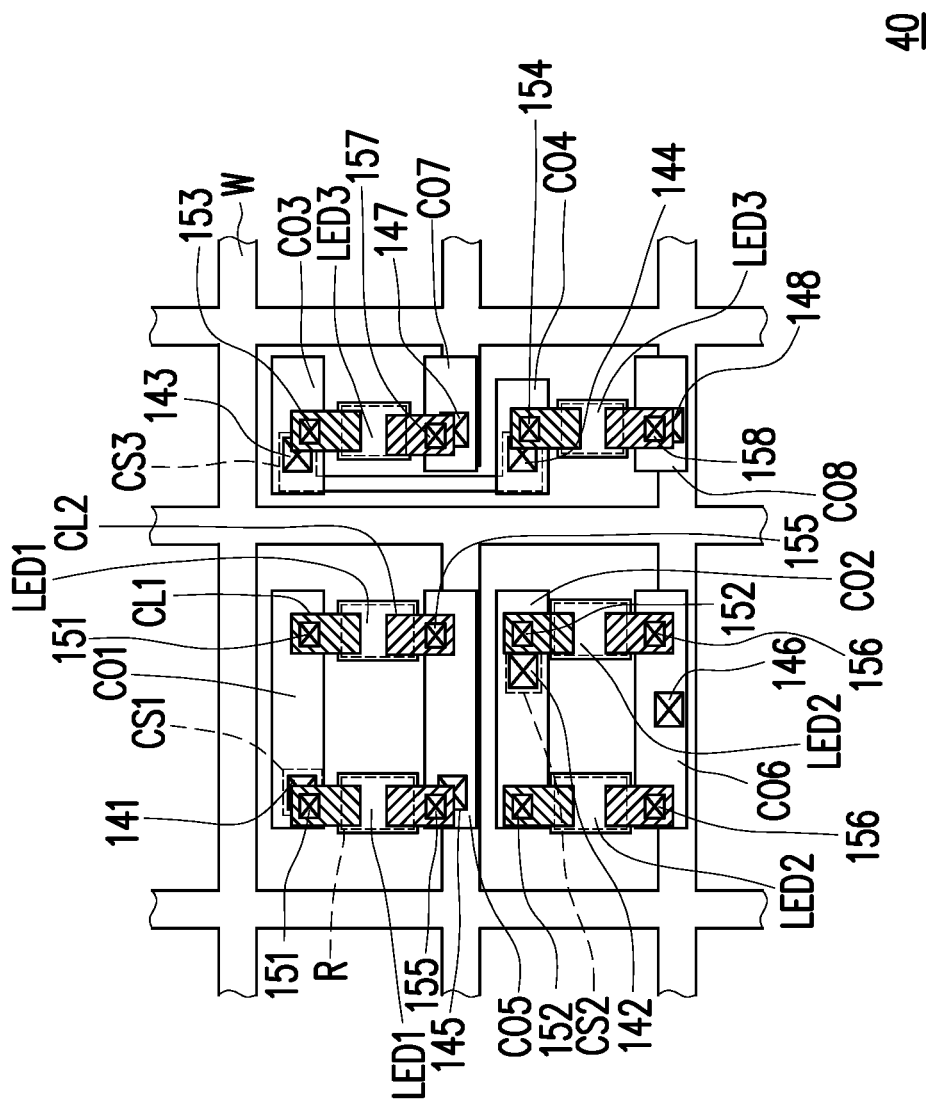
FIG. 6 is a schematic top view of a display device according to another embodiment of the present invention.

FIG. 6 is a schematic top view of a display device according to another embodiment of the present invention. It is to be noted that the embodiment of FIG. 6 follows the component numbers and parts of the embodiment of FIG. 1E, wherein the same or similar elements are denoted by the same or similar reference numerals, and the description of the same technical content is omitted. For the description of the omitted portions, reference may be made to the foregoing embodiments, and the following embodiments are not repeated.

The difference between the embodiment of FIG. 6 and the embodiment of FIG. 1E is that the embodiment of FIG. 6 does not have the fourth conductive structure CS4.

In this embodiment, the plurality of third light emitting diodes LED3 are electrically connected to the third pixel circuit PC3 by the third conductive structure CS3. For example, the conductive structure CS3 is electrically connected to the third conductive oxide CO3 through the third hole 143, and the conductive structure CS3 is electrically connected to the fourth conductive oxide CO4 through the fourth hole 144.

Since the third conductive oxide CO3 and the fourth conductive oxide CO4 are electrically connected to the conductive structure CS3, the arrangement of fourth conductive structure CS4 (shown in FIG. 1B) and the fourth opening 134 (shown in FIG. 1B) can be reduced.

Based on the above, the display device 40 of the present invention can improve the problem of transposition errors caused by the transpositions of light emitting diodes by a mass transfer technique and reduce the impedance in the display device, thereby improving the display quality of the display device.

In summary, the display device of the present invention can improve the problem of transposition errors caused by the transpositions of the light emitting diodes by a mass transfer technique, and reduce the impedance in the display device, thereby improving the display quality of the display device.

The present invention has been disclosed in the above embodiments, and is not intended to limit the present invention. Any one of ordinary skill in the art can make a few changes without departing from the spirit and scope of the invention. The scope of protection of the present invention is defined by the scope of the appended claims.

What is claimed is:
1. A display device, comprising:
a substrate;
a first pixel circuit, a second pixel circuit, and a third pixel circuit, disposed on the substrate, wherein the second pixel circuit is located between the first pixel circuit and the third pixel circuit;
a protective layer, covering the first pixel circuit, the second pixel circuit, and the third pixel circuit;
a first conductive structure, electrically connected to the first pixel circuit through a first opening of the protective layer;
a second conductive structure, electrically connected to the second pixel circuit through a second opening of the protective layer;
a third conductive structure, electrically connected to the third pixel circuit through a third opening of the protective layer;

a plurality of first light emitting diodes, overlapping the first pixel circuit and the second pixel circuit, and electrically connected to the first conductive structure;

a plurality of second light emitting diodes, overlapping the first pixel circuit and the second pixel circuit, and electrically connected to the second conductive structure;

a plurality of third light emitting diodes, overlapping with the third pixel circuit and electrically connected to the third conductive structure, wherein the first pixel circuit is configured to control the plurality of first light emitting diodes, the second pixel circuit is configured to control the plurality of second light emitting diodes, and the third pixel circuit is configured to control the plurality of third light emitting diodes.

2. The display device as claimed in claim 1, further comprising a fourth conductive structure, electrically connected to the third pixel circuit through a fourth opening of the protective layer, wherein at least one of the plurality of third light emitting diodes is electrically connected to the fourth conductive structure.

3. The display device of claim 1, wherein the plurality of first light emitting diodes are arranged along a first direction, the plurality of second light emitting diodes are arranged along the first direction, the plurality of third light emitting diodes are arranged along a second direction, and the first direction is different from the second direction.

4. The display device as claimed in claim 1, further comprising an adhesive layer, disposed between the plurality of first light emitting diodes and the protective layer, between the plurality of second light emitting diodes and the protective layer, and between the plurality of third light emitting diodes and the protective layer.

5. The display device as claimed in claim 1, further comprising a wire, electrically connected to the plurality of first light emitting diodes, the plurality of second light emitting diodes, and the plurality of third light emitting diodes, wherein the wire is a mesh structure having a plurality of apertures, and the plurality of first light emitting diodes, the plurality of second light emitting diodes, and the plurality of third light emitting diodes are disposed corresponding to the plurality of apertures.

6. The display device as claimed in claim 5, wherein at least a portion of a vertical projection of the wire on the substrate is located between a vertical projection of the plurality of first light emitting diodes on the substrate and a vertical projection of the plurality of second light emitting diodes on the substrate, and overlapped with the first pixel circuit and the second pixel circuit.

7. The display device as claimed in claim 5, wherein at least a portion of a vertical projection of the wire on the substrate is located between a vertical projection of the plurality of first light emitting diodes on the substrate and a vertical projection of the plurality of third light emitting diodes on the substrate.

8. The display device as claimed in claim 5, further comprising the fourth conductive structure, electrically connected to the third pixel circuit through a fourth opening of the protective layer, the plurality of third light emitting diodes being electrically connected to the fourth conductive structure, wherein at least a portion of a vertical projection of the wire on the substrate is between vertical projections of two adjacent third light emitting diodes of the plurality of third light emitting diodes on the substrate.

9. The display device as claimed in claim 8, further comprising:

an insulating layer, covering the first conductive structure, the second conductive structure, and the third conductive structure;

a first conductive oxide, electrically connected to the first conductive structure through a first hole of the insulating layer;

a second conductive oxide, electrically connected to the second conductive structure through a second hole of the insulating layer;

a third conductive oxide, electrically connected to the third conductive structure through a third hole of the insulating layer;

a fourth conductive oxide, electrically connected to the fourth conductive structure through a fourth hole of the insulating layer;

a fifth conductive oxide, electrically connected to the wire through a fifth hole of the insulating layer;

a sixth conductive oxide, electrically connected to the wire through a sixth hole of the insulating layer;

a seventh conductive oxide, electrically connected to the wire through a seventh hole of the insulating layer; and an eighth conductive oxide, electrically connected to the wire through an eighth hole of the insulating layer, wherein the first conductive oxide and the fifth conductive oxide are electrically connected to the first light emitting diodes, the second conductive oxide and the sixth conductive oxide are electrically connected to the second light emitting diodes, and the third conductive oxide, the fourth conductive oxide, the seventh conductive oxide and the eighth conductive oxide are electrically connected to the third light emitting diodes.

10. The display device as claimed in claim 9, wherein:

a vertical projection of the first conductive oxide on the substrate is located on a first side of a vertical projection of the first light emitting diodes on the substrate;

a vertical projection of the fifth conductive oxide on the substrate is located on a second side of the vertical projection of the first light emitting diodes on the substrate;

a vertical projection of the second conductive oxide on the substrate is located on a first side of a vertical projection of the second light emitting diodes on the substrate; and a vertical projection of the sixth conductive oxide on the substrate is located on a second side of the vertical projection of the second light emitting diodes on the substrate.

11. The display device as claimed in claim 9, wherein the plurality of third light emitting diodes are arranged along a second direction, and the third conductive oxide, the seventh conductive oxide, the fourth conductive oxide and the eighth conductive oxide are sequentially arranged along the second direction.

* * * * *